United States Patent
Wei

(10) Patent No.: US 7,126,820 B2
(45) Date of Patent: Oct. 24, 2006

(54) MODULAR PLATFORM SYSTEM AND APPARATUS

(75) Inventor: Wen Wei, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 172 days.

(21) Appl. No.: 10/869,179

(22) Filed: Jun. 15, 2004

(65) Prior Publication Data

US 2005/0099771 A1    May 12, 2005

Related U.S. Application Data

(60) Provisional application No. 60/519,194, filed on Nov. 11, 2003.

(51) Int. Cl.
    *H05K 7/20*    (2006.01)

(52) U.S. Cl. .................... 361/695; 361/690; 361/694; 361/724

(58) Field of Classification Search ............... 361/694, 361/690, 692, 695, 724; 165/80.3, 122; 454/184
See application file for complete search history.

(56) References Cited

U.S. PATENT DOCUMENTS 5,995,368 A * 11/1999 Lee et al. .................. 361/695
6,499,609 B1 * 12/2002 Patriche et al. ............ 211/175
6,813,152 B1 * 11/2004 Perazzo ..................... 361/695
2003/0007146 A1 * 1/2003 Malczewski et al. ....... 356/311
2005/0052843 A1    3/2005 Baker et al.

FOREIGN PATENT DOCUMENTS

GB      2 387 716 A      10/2003
JP      03-231496      * 10/1991

OTHER PUBLICATIONS

Advanced TCA™, PICMG® 3.0 Revision 1.0, Advanced TCA™ Base Specification, Dec. 30, 2002, pp. i-414.
Release Notes, PICMG ECN 3.0-1.0-001, Feb. 17, 2004, pp. 1-4, with AdvancedTCA®, PICMG Specification, Engineering Change Notice 3.0-1.0-001, Jan. 14, 2004, Affected Specification: PICMG 3.0 R1.0, pp. i-D-12.

* cited by examiner

Primary Examiner—Michael Datskovsky
Assistant Examiner—Robert J. Hoffberg
(74) Attorney, Agent, or Firm—Schwabe, Williamson & Wyatt, P.C.

(57) ABSTRACT

A modular platform is provided. The modular platform includes a modular platform shelf configured to receive modular platform boards, and a dual plenum coupled to the modular platform shelf, the modular platform configured to couple to a plenum portion of a dual plenum of another modular platform or a stand-alone plenum.

16 Claims, 2 Drawing Sheets

MODULAR PLATFORM SYSTEM AND APPARATUS

RELATED APPLICATIONS

This application claims the benefit of U.S. Provisional Application No. 60/519,194 filed on Nov. 11, 2003.

FIELD OF THE INVENTION

Embodiments in accordance with the present invention generally relate to modular computing systems, such as, systems in accordance or in compliance with the specification of the Advanced Telecommunications Computing Architecture (Advanced TCA). More specifically, disclosed embodiments of the invention relate to modular platform configurations to enhance modular platform cooling and maximizing use of space in system form factors.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

Figure 1:
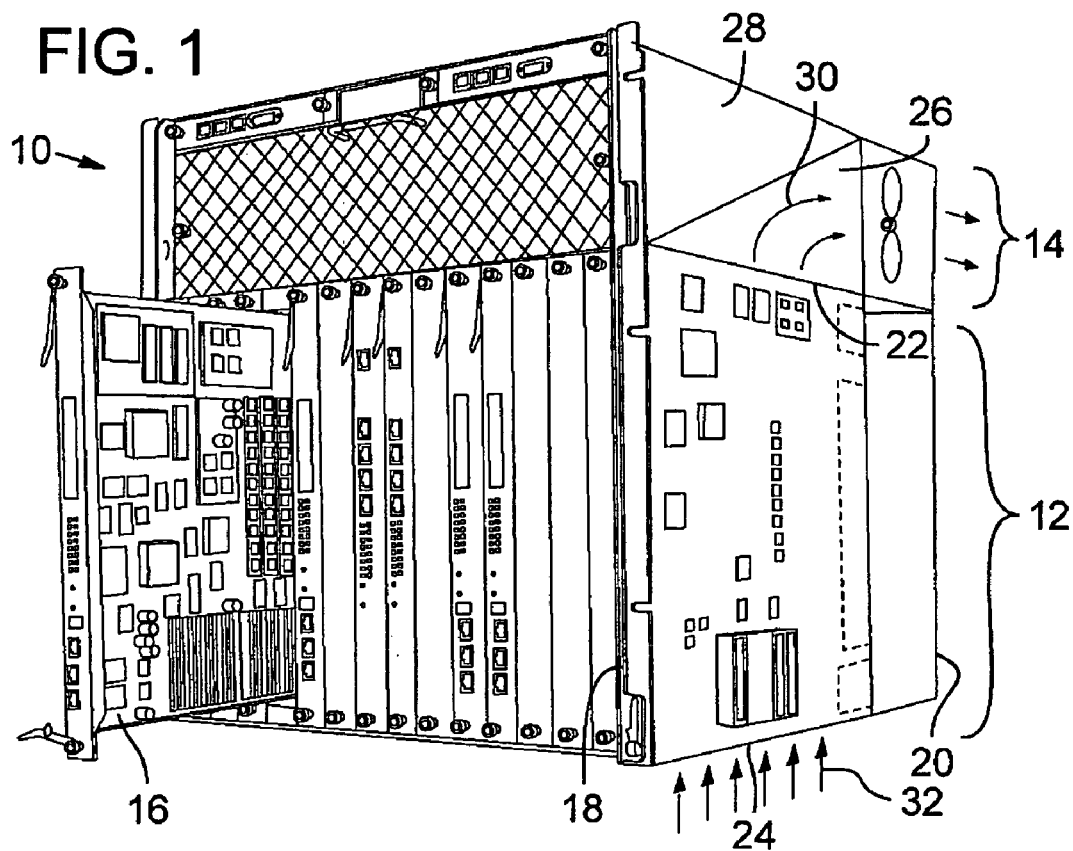
FIG. 1 illustrates a front/side isometric view of a modular platform in accordance with an embodiment of the present invention.

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Modular platforms may be used in a variety of applications, including but not limited to telecommunications applications, flexi-servers and the like. Many of these applications have one or more specifications that may govern various parameters of certain particular components of the modular platform and configuration restrictions and/or requirements. One such example of a governing standard is the PCI Industrial Computer Manufacturers Group (PICMG) 3.0 Advanced TCA Specification (Advanced TCA Specification), which is targeted to the next generation of carrier grade communication equipment.

The Advanced TCA Specification may require, for example, that the modular platform include various components, such as intake and exhaust plenums, blade racks or modular platform shelves, fan modules for cooling the modular platform boards inserted in the modular platform shelf, power entry modules, a backplane, a rear transition module (RTM), and the like. Further, many specifications require modular platforms to be constrained to certain dimensional requirements, such as height, width, and length. In the Advanced TCA Specification, for example, the dimensions of the modular platforms are regulated, either directly or indirectly.

Another standard that affects the configurations of modular platforms for the telecommunications industry, for example, is the Electronic Industries Association (EIA) standard specification 310-D-1992 (EIA Specification), which includes provisions governing the system form factors or racks in which the modular platforms may be inserted. The EIA Specification may require, for example, that the system rack have an overall height of the stacked components 42U, where 1U=1.75 inches. Accordingly, to maximize the density of the modular platforms and get as much computing power as possible in system racks, one of most important dimensions is the height of the individual modular platforms, including the intake and exhaust plenums generally necessary to adequately cool the components within the modular platform.

Embodiments in accordance with the present invention provide modular platform configurations that may enable higher density placement of modular platforms in system racks, where modular platform space may be constrained. The Advanced TCA Specification, for example, requires the portion of the modular platform that receives the modular platform board (modular platform shelf) be about 8U. The height of the intake or exhaust plenums are typically 2U. Typical modular platforms in the telecommunications industry may have an overall height of 12U to 14U. Accordingly, only three of these current configurations may be positioned in a 42U system rack. Modular platforms in accordance with embodiments of the present invention may enable the high-density stacking of up to four modular platforms per 42U rack, which can increase the microelectronic device density and computing power, and yet allow for sufficient cooling of the modular platform boards.

Modular platforms in accordance with embodiments of the present invention may include a modular platform shelf coupled to a dual plenum as a single unit, such that four modular platforms, when stacked with similarly configured modular platforms may be positioned in a 42U system rack. In another embodiment, a power module, such as a power entry module (PEM) in Advanced TCA Specification compliant modular platforms, may be remotely positioned such that a dual plenum may be used without interference by the power module with an exhaust portion of the dual plenum.

FIG. 1 illustrates a front/side perspective view of a modular platform in accordance with an embodiment of the present invention. Modular platform 10 may include a modular platform shelf 12 and an integrated dual plenum 14. Modular platform shelf 12 may include a back plane (not shown), and be configured to receive a plurality of modular platform boards 16. Modular platform shelf 12 may have a front side 18, in which the modular platform boards 16 are removably inserted, and a back side 20. Modular platform shelf 12 may also have a first end 22 and a second end 24.

Each of modular platform boards 16 may be configured with any number of electronic components to accommodate the necessary functionality required. Such electronic components may include, but are not limited to, microprocessors, chip sets, memory, PCI Express or advance switching compatible components, capacitors, transistors, and the like.

Given these components, modular platform boards 16 can generate a substantial amount of heat that must be dissipated in order to maintain the microelectronic components on the modular platform boards at an operating temperature that meets or is lower than a thermal operating environment temperature known to result in modular platform boards having an acceptable mean time between failure.

The Advanced TCA Specification requires, for example, that the modular platform be designed to accommodate up to sixteen modular platform boards, with each slot able to carry a modular platform board capable of generating up to 200 Watts of power. The modular platform must be actively cooled by a cooling medium so that the surrounding air temperature rise across the modular platform is less than 10 degrees Celsius at any given time. A cooling medium, including, but not limited to air, may be circulated past modular platform boards 16 and vented to meet cooling requirements.

Dual plenum 14 may have a first plenum portion 26 and a second plenum portion 28 and may be coupled to a first end 22 of modular platform shelf 12. Where, for example, the first end 22 of the modular platform shelf 12 is designated to be the exhaust end for the cooling medium, first plenum portion 26 may be configured to aid in exhausting the cooling medium from the modular platform, as shown by flow 30, using, for example, fan configurations. Second plenum portion 28 may be configured to couple to another modular platform (not shown) and act as an intake plenum therefor.

It can be appreciated that the dual plenum used in accordance with embodiments of the present invention be a variety of configurations, including, but not limited to, a single removable fan tray, dual removable fan trays, and the like. Copending application Ser. No. 10/748,385 includes examples of different dual plenum configurations that may be used with embodiments in accordance with the present invention. Further, it can be appreciated that the first plenum portion 26 may be separated from the second plenum portion 28 in a variety of ways. In one embodiment, shared plenum may include a physical barrier between the inlet and outlet of a single plenum, which in turn may enable the plenum to be shared by adjacent modular platform shelf modules.

In another embodiment, a modular platform may include a dual plenum coupled to the second end of the modular platform shelf. Where the second end of the modular platform shelf is designated to be the intake location for the cooling medium, the second plenum portion may be the intake plenum and configured to couple to the second end of the modular platform shelf. The first plenum portion then may be configured to couple to the first end of an adjacent modular platform in accordance with embodiments of the present invention.

In one embodiment, where the modular platform is governed directly or indirectly by the Advanced TCA Specification and/or the EIA Specification, the modular platform shelf 12 may have a height substantially equal to 8U and the integrated dual plenum may have a height of less than or equal to 2U. Modular platform 10, then, may have an overall height of less than or equal to 10U. As discussed with respect to FIGS. 3A–3B, modular platforms having an overall height of 10U or less may enable increased density of modular platforms and electronic components in a 42U system rack.

In another embodiment in accordance with the present invention, a 10U modular platform shelf may also have an individual half plenum on both the top and bottom of the modular platform shelf. The shape and positioning of the inlet plenum and exhaust plenum may be sized to accommodate additional modular platform shelf stacked above or below, such that four 10U modular platform shelves may be positioned in one 42U form factor. This also may eliminate the need for either an additional upper or base plenum.

In addition to the shared plenum enabling higher density by allowing for four modular platform shelves to be stacked in a 42U form factor, the modular platform having an integrated dual plenum has a number of benefits. For example, the modularized configuration enables easy stacking, configuration, removal and/or replacement, the structure may be as strong and stable as the current 14U modular platform modules, lower manufacturing and shipping costs as less material may be required. Embodiments of modular platforms in accordance with the present invention may also result in better mechanical characteristics and performance, such as overall strength and durability, due to the compact size.

Figure 2:
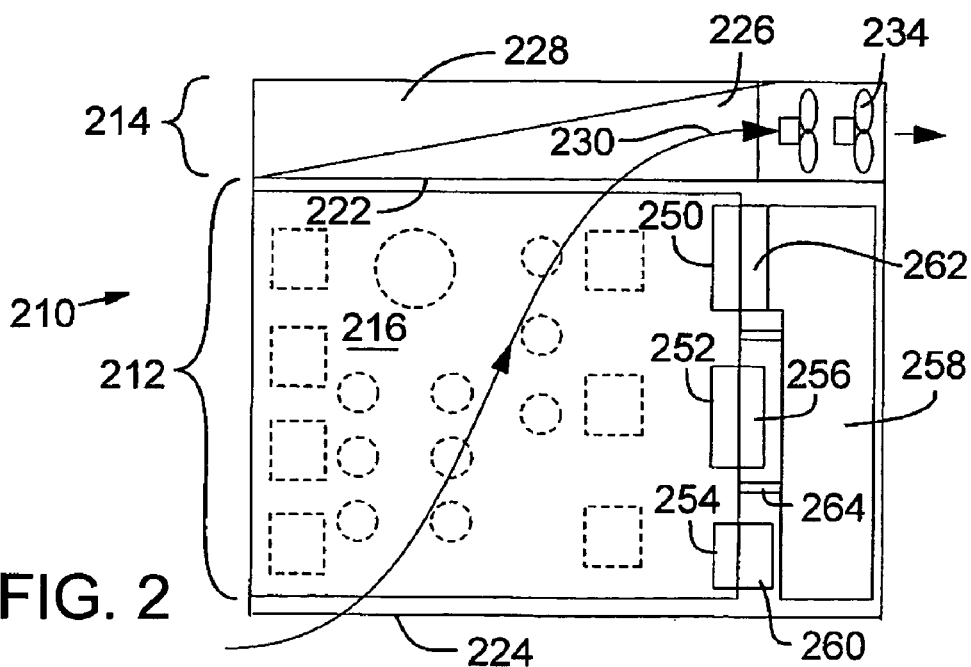
FIG. 2 illustrates a cross-sectional view of the modular platform in accordance with an embodiment of the present invention.

FIG. 2 illustrates a cross sectional view of the modular platform in accordance with an embodiment of the present invention. Modular platform 210 may include a modular platform shelf 212 coupled to a dual plenum 214. First end 222 of modular platform shelf 212 may be coupled to first plenum portion 226 such that modular platform shelf 212 is in fluid communication therewith to aid in exhausting cooling medium from the modular platform 210, as shown by flow 230.

In addition to multiple electronic components, modular platform board 216 may include an RTM interface 250 that may allow the modular platform boards 216 to connect to various sources and devices, via configurations and protocols including, but not limited to USB, Institute of Electrical and Electronics Engineers (IEEE) 1394, serial, ethernet, sonet, and other interface configurations. RTM 258, which may be adapted for electrical communication with RTM interface 250, may also include a plurality of electronic components, as well as a plurality of interface connectors, including, but not limited to, cable terminations and options for variety of interconnects such as fiberoptic, coaxial cables, and future types of connectors.

Modular platform board 216 may also include other rear side interfaces, such as backplane interface 252 and power entry interface 254. Backplane interface 252 may interface with a modular platform shelf backplane 256. Backplane 256 may provide a variety of functions within modular platform shelf 216, including, but not limited to power control/distribution to the modular platform boards, management and data transport functions to and between modular platform boards, and act as control and data planes.

Power entry interface 254 may allow for a modular platform board 216 to interface with a PEM 260. PEM 260 may be required and may be responsible for supporting the power supply needs to the modular platform. Current modular platforms typically position the PEM below the second side 224 of the modular platform 210, such that it would normally be positioned in the intake plenum for the modular platform. So positioning the PEM may not be practical when using a modular platform in accordance with embodiments of the present invention, as it may result in the PEM blocking the second plenum portion or, for example, the exhaust of an adjacent modular platform. This placement of the PEM may disrupt the flow of the cooling medium and may lead to modular platform board failure.

In one embodiment in accordance with the present invention, the PEM may be remotely positioned, such that it does not interfere with the exhausting of the cooling medium from an adjacent modular platform dual plenum exhaust portion. Locations suitable for remote placement of the PEM can be many, and may include, but are not limited to placing the PEM on the outside of the system rack, or on an unoccupied shelf. The PEM may be interconnected to the PEM interface zone of a modular platform board in a variety of ways, including, but not limited to high-capacity cables. By having the PEM remotely located, it may be readily serviceable from an easily accessible location, without having to remove the RTM from the modular platform, or the modular platform board. The remote PEM may also be used in applications where the governing specifications restrict not only rack height but also have tighter restrictions on modular platform depth.

In one embodiment in accordance with the present invention, as shown in FIG. 2, PEM 260 may be positioned between the RTM and PEM interface zone 254 located at or near the backside of the modular platform 210. In order to accommodate positioning of the PEM between the RTM and the rear portion of modular platform board 216, the RTM may be offset from the rear portion of modular platform board 216 a sufficient distance to allow the PEM 260 to be directly coupled to RTM interface zone 254.

In many modular platform systems, such as those governed by the Advanced TCA Specification, one goal may be to get as much computing power into a single system rack as possible. As previously discussed, currently, due to component requirements, and restrictions on modular platform configurations, modular platforms having single intake and cooling plenums can take up 12U to 14U in height, which results in only three modular platforms being stacked in a single 42U rack.

Figures 3A, 3B:
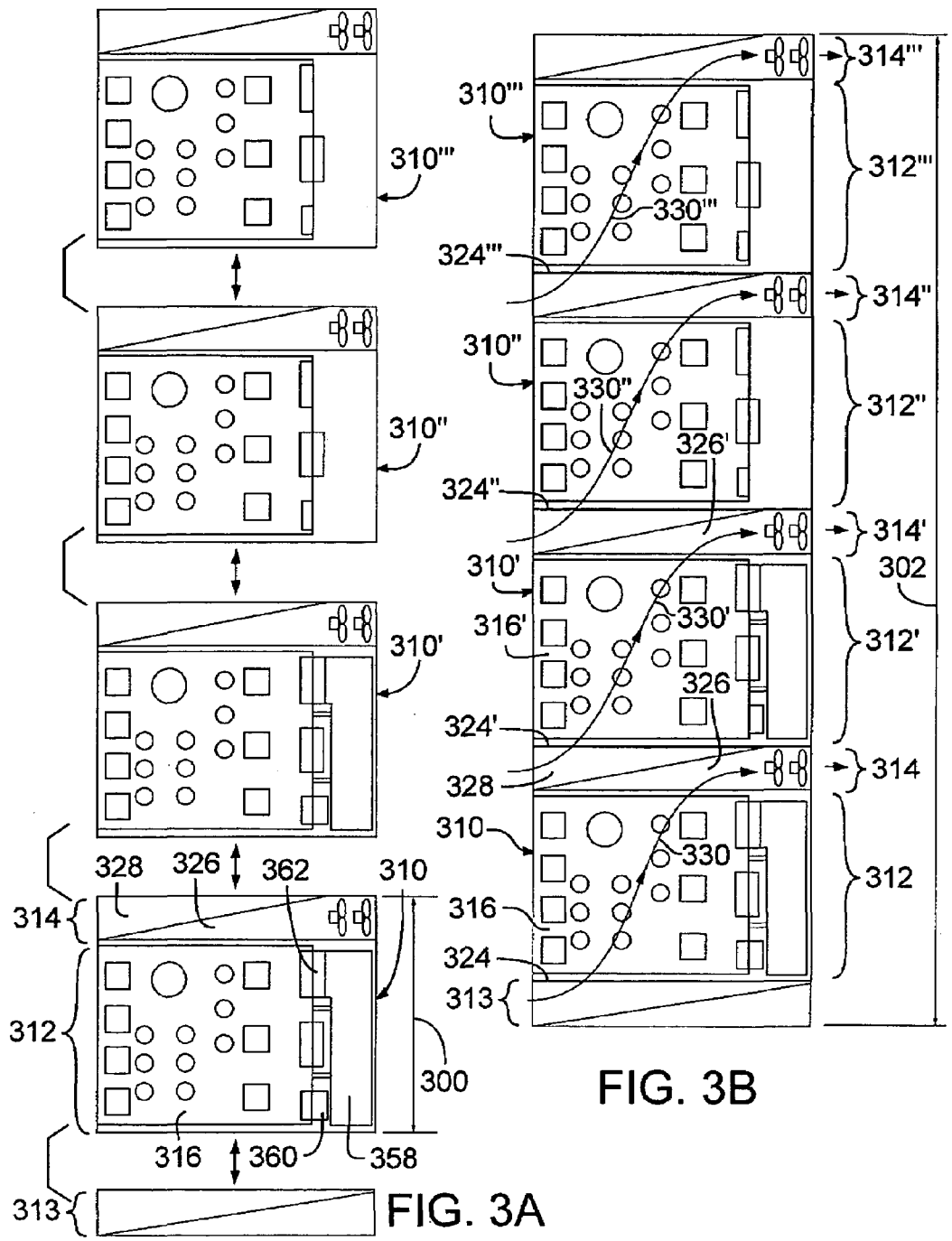
FIGS. 3A–3B illustrate a cross-sectional view of stacked modular platforms in accordance with an embodiment of the present invention.

To allow for a four modular platform shelf stack in a 42U system rack, embodiments in accordance with the present invention provide separate 10U modular platform shelves that share a plenum, such that each plenum may act as an inlet for one modular platform shelf and an outlet for another. FIGS. 3A–3B illustrate a cross-sectional view of modular platforms in accordance with an embodiment of the present invention. FIG. 3A illustrates four modular platforms in accordance with an embodiment of the present invention, where the modular platforms are in an unassembled arrangement.

In the configuration shown, modular platform 310 may include a modular platform shelf 312 configured to receive a plurality of modular platform boards 316 and a dual plenum 314 as a single modular unit. Where, for example, a modular platform must conform to the Advanced TCA Specification, each modular platform may have an overall modular platform height 300 of approximately 10U, where the modular platform shelf 312 may be approximately 8U and the dual plenum 314 may be approximately 2U.

Modular platforms 310', 310" and 310'" may be similarly configured as that of modular platform 310, in that they include a modular platform shelf and a dual plenum. The configuration of the modular platform boards 316 used in the modular platforms, however, is application specific. It can be appreciated that numerous modular platform board configurations may be used within the same modular platform, and may also vary from modular platform to modular platform, depending on the function each modular platform is required to fulfill.

In one embodiment, where an RTM is used, RTM 358 may be offset, such that PEM 360 may be positioned behind the rear portion of the modular platform board 316. It can be appreciated, however, that where an RTM is not used, for example as shown with respect to modular platform 310" and 310'", the PEM 360 may be positioned above the second end 324 of the modular platform shelf 312 without interference with the RTM in order to avoid impedance with an adjacent exhaust plenum portion. Further, in one embodiment, the PEM for any given modular platform may be remotely positioned, outside the confines of the modular platform 310.

FIG. 3B illustrates the plurality of modular platforms of FIG. 3A in a stacked configuration in a system rack. As stacked, the first plenum portion 326 of the dual plenum 314 may act as the exhaust plenum for modular platform 310. Second plenum portion 328 may act as the intake plenum for adjacent modular platform 310' when stacked in a vertical array. In one embodiment, the second end 324' of modular platform 310' may interface with second plenum portion 328 of modular platform 310 to allow a cooling medium to enter second plenum portion 328, pass through the modular platform boards 316', and exhaust from first plenum portion 326' as shown by flow 330'. A similar stacked configuration may exist between modular platform 310' and modular platform 310", and likewise between modular platform 310" and modular platform 310'".

In system racks where the overall height is restricted, depending on the positioning of the dual plenum with respect to the modular platform shelf to construct the modular platform, an additional stand-alone plenum may be required. In one embodiment, where a plurality of modular platform 310, 310', 310", 310'" include dual plenums integral with the first side of the modular platform shelves 312, 312', 312", and 312'", for example the exhaust side, a stand-alone plenum 313 may be required for the lower most modular platform 310, which, in the embodiment illustrated in FIG. 3B, would serve as an intake plenum.

In one embodiment, where the system rack form factor is restricted to a height 302 of 42U, the stand-alone plenum 313 may be restricted to 2U or less in height. This may allow for up to four modular platforms having a height of 10U to be stacked, such that as a staked unit, all modular platforms have a sufficient flow of cooling medium, as shown by flow 330, 330', 330", and 330'".

In one embodiment in accordance with the present invention, where the individual modular platform includes dual plenums coupled to the second end of the modular platform shelf, or the intake end, the additional stand-alone plenum may be required to be positioned at the first side, or exhaust end of the upper most modular platform. It can be appreciated that the individual modular platform configurations in accordance with embodiments of the present invention, and the positioning of the shared plenum may be application specific. It can be appreciated that the stand-alone plenum may be a variety of configurations, such as a dual plenum, a single plenum, removable, nonremovable, it may include an active ventilation source, such as fans in a variety of configurations. Placement and configuration of the stand-alone plenum depends on the overall configuration of the modular platforms that are being stacked in a system rack.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A modular platform comprising:
a modular platform shelf having a first end, the modular platform shelf configured to receive one or more modular platform boards;
a first dual plenum having a first plenum portion and a second plenum portion, the first plenum portion coupled to the first end of the modular platform shelf, and the second plenum portion adapted to interface with a second end of another modular platform shelf of an adjacent modular platform;
a power entry module adapted to electrically interconnect to the one or more modular platform boards;
and a rear transition module configured to interconnect to a rear transition module interface, the rear transition module having a standoff distance sufficient to allow the power entry module to be positioned substantially between the rear transition module and a rear portion of the corresponding modular platform board.

2. The modular platform of claim 1, wherein the first end of the modular platform shelf is an exhaust end for a cooling medium and the first plenum portion is adapted to exhaust the cooling medium from the modular platform.

3. The modular platform of claim 2, wherein the first plenum portion includes a plurality of fans to actively exhaust the cooling medium.

4. The modular platform of claim 1, wherein the first dual plenum has an overall height of less than or equal to 2U and the modular platform shelf has an overall height of less than or equal to 8U.

5. A system comprising:
a rack; and
a plurality of modular platforms mounted in the rack, at least one of the modular platforms including
a modular platform shelf having a first end, the modular platform shelf configured to removably receive one or more modular platform boards, and
a first dual plenum having a first plenum portion and a second plenum portion, the first plenum portion coupled to the first end of the modular platform shelf, and the second plenum portion adapted to interface with a second end of an another modular platform shelf of an adjacent modular platform;
a power entry module adapted to electrically interconnect to the one or more modular platform boards;
and a rear transition module configured to interconnect to a rear transition module interface, the rear transition module having a standoff distance sufficient to allow the power entry module to be positioned substantially between the rear transition module and a rear portion of the corresponding modular platform board.

6. The system of claim 5, wherein the first end of the modular platform shelf is an exhaust end for a cooling medium and the first plenum portion is adapted to exhaust the cooling medium from the modular platform.

7. The system of claim 6, wherein the first plenum portion includes a plurality of fans to actively exhaust the cooling medium.

8. The system of claim 5, wherein the dual plenum has a height of less than or equal to 2U and the modular platform shelf has a height of less than or equal to 8U.

9. The system of claim 8, wherein four modular platforms are positioned in the rack, the system further including a stand-alone plenum adapted to couple to one of the four modular platforms.

10. The system of claim 9, wherein the stand-alone plenum has an overall height of less than or equal to 2U.

11. The system of claim 10, wherein the overall height of the four modular platforms and the stand-alone plenum is less than or equal to 42U.

12. A method of arranging modular platforms, comprising: providing at least a first and a second modular platform, each including a dual plenum, a modular platform shelf, a power entry module, and a rear transition module, the dual plenum of the first modular platform having a first plenum portion and a second plenum portion, the first plenum portion being coupled to and in fluid communication with a first end of the modular platform shelf of the first modular platform;
positioning the power entry module substantially between the rear transition module and a rear portion of the corresponding modular platform board;
providing a stand-alone plenum;
stacking the first and second modular platforms in vertical array, wherein a second end of the modular platform shelf of the second modular platform is in fluid communication with the second plenum portion of the dual plenum of the first modular platform; and
stacking the first modular platform in a vertical array with the stand-alone plenum so that the stand-alone plenum is in fluid communication with a second end of the modular platform shelf of the first modular platform.

13. The method of claim 12, wherein each of the modular platform shelves of the first and second modular platforms include an intake end to receive a cooling medium and an exhaust end for exhausting the cooling medium, and the stacking of the first and second modular platforms further includes:
coupling the intake end of the first modular platform to the stand-alone plenum;
coupling the intake end of the second modular platform to the second plenum portion of the dual plenum of the first modular platform; and
coupling the intake end of the first modular platform to the stand-alone plenum.

14. A method of arranging modular platforms, comprising:
providing a first, second, third, and fourth modular platform, each including a dual plenum, a modular platform shelf having a first end and a second end, a power entry module, and a rear transition module, each dual plenum of each modular platform having a first plenum portion and a second plenum portion, the first plenum portion of each dual plenum each modular platform being coupled to a first end of a corresponding to modular platform shelf;
positioning the power entry module substantially between the rear transition module and a rear portion of the corresponding modular platform board;
providing a stand-alone plenum; and
stacking the first, second, third, and fourth modular platforms and the stand-alone plenum in a system rack, wherein each of at least three modular platform shelves are in fluid communication with a separate one of the first plenum portions and one of the second plenum portions, and at least one of the modular platforms is in fluid communication with a different one of the first plenum portions and the stand-alone plenum.

15. The method of claim 14, wherein stacking the modular platforms includes:
coupling the second end of the modular platform shelf of the first modular platform to the stand-alone plenum;
coupling the second end of the modular platform shelf of the second modular platform to the second plenum portion of the dual plenum of the first modular platform;
coupling the second end of the modular platform shelf of the third modular platform to the second plenum portion of the dual plenum of the second modular platform; and
coupling the second end of the modular platform shelf of the fourth modular platform to the second plenum portion of the dual plenum of the third modular platform.

16. The method of claim 15, wherein the second end of the modular platform shelf of each modular platform is an intake end for a cooling medium and the second plenum portion of each dual plenum of at least the first, second, and third modular platforms acts as the intake plenum for an adjacent modular platform.

* * * * *

UNITED STATES PATENT AND TRADEMARK OFFICE
CERTIFICATE OF CORRECTION

PATENT NO. : 7,126,820 B2  Page 1 of 1
APPLICATION NO. : 10/869179
DATED : October 24, 2006
INVENTOR(S) : Wen Wei It is certified that error appears in the above-identified patent and that said Letters Patent is hereby corrected as shown below:

Column 4
Lines 45-46, "...modular platform shelf 216,..." should read --...modular platform board 216,...--.

Column 7
Lines 18-20 and 51-53, "...and a rear transition module configured to interconnect to a rear transition module interface, the rear transition module having a standoff distance sufficient to allow..." should read --...and a rear transition module interface configured to interconnect to a rear transition module, the rear transition module interface having a standoff distance sufficient to allow...--.

Column 7
Line 46, "...of an another..." should read --...of another...--.

Column 8
Line 24, "...in vertical array..." should read --...in a vertical array...--.

Column 8
Lines 54-55, "...of a corresponding to modular platform..." should read --...of a corresponding modular platform...--.

Signed and Sealed this

Thirty-first Day of March, 2009

JOHN DOLL
*Acting Director of the United States Patent and Trademark Office*